United States Patent
Beasom

(10) Patent No.: US 7,067,383 B2
(45) Date of Patent: Jun. 27, 2006

(54) METHOD OF MAKING BIPOLAR TRANSISTORS AND RESULTING PRODUCT

(75) Inventor: James Douglas Beasom, Melbourne Village, FL (US)

(73) Assignee: Intersil Americas, Inc., Milipitas, CA (US)

(*) Notice: Subject to any disclaimer, the term of this patent is extended or adjusted under 35 U.S.C. 154(b) by 114 days.

(21) Appl. No.: 10/793,901

(22) Filed: Mar. 8, 2004

(65) Prior Publication Data

US 2005/0196930 A1  Sep. 8, 2005

(51) Int. Cl.
*H01L 21/331* (2006.01)

(52) U.S. Cl. .................. 438/377; 438/311; 438/555

(58) Field of Classification Search ............... 438/377, 438/327, 336, 311, 555
See application file for complete search history.

(56) References Cited

U.S. PATENT DOCUMENTS

| | | | | |
|---|---|---|---|---|
| 4,106,954 A | * | 8/1978 | de Brebisson et al. | 438/370 |
| 4,485,552 A | * | 12/1984 | Magdo et al. | 438/322 |
| 4,551,906 A | * | 11/1985 | Ogura et al. | 438/339 |
| 4,975,751 A | | 12/1990 | Beasom | 257/172 |
| 5,036,021 A | * | 7/1991 | Goto | 438/355 |
| 5,091,336 A | | 2/1992 | Beasom | 438/135 |
| 5,837,590 A | * | 11/1998 | Latham et al. | 438/364 |
| 5,849,613 A | * | 12/1998 | Peidous | 438/202 |
| 6,080,614 A | * | 6/2000 | Neilson et al. | 438/238 |
| 6,555,894 B1 | | 4/2003 | Beasom | 257/593 |

OTHER PUBLICATIONS

S. Wolf, "Silicon Processing for the VLSI Era," vol. II, 1990, pp. 468-472.*
Wolf, "Silicon Processing for the VLSI Era", 1990, vol. II, p. 471.*

* cited by examiner

*Primary Examiner*—Bradley K. Smith
*Assistant Examiner*—Steven J Fulk
(74) *Attorney, Agent, or Firm*—Barnes & Thornburg LLP

(57) ABSTRACT

A method of forming bipolar transistors by using the same mask to form the collector region in a substrate of an opposite conductivity type as to form the base in the collector region. More specifically, impurities of a first conductivity type are introduced into a region of a substrate of a second conductivity type through a first aperture in a first mask to form a collector region. Impurities of the second conductivity type are introduced in the collector through the first aperture in the first mask to form the base region. Impurities of the first conductivity type are then introduced into the base region through a second aperture in a second mask to form the emitter region. The minimum dimension of the first aperture of the first mask is selected for a desired collector to base breakdown voltage. This allows tuning of the breakdown voltage.

14 Claims, 2 Drawing Sheets

METHOD OF MAKING BIPOLAR TRANSISTORS AND RESULTING PRODUCT

BACKGROUND AND SUMMARY OF THE DISCLOSURE

The present disclosure relates generally to integrated circuits and, more specifically, to a method of forming bipolar transistors.

Complementary vertical bipolar processes require lightly doped N and P island to act as the collectors for the NPN and PNP bipolar transistors, respectively. A common method to form the complementary bipolar devices with respect to the substrate layer of one type, for example, N-type, is to form the opposite type collector by implanting P-type impurities through a collector mask and is usually followed by diffusion. The N base for the PNP transistor is formed after the collector diffusion using a separate base mask having a base aperture therein. N-type impurities are then implanted and diffused to define the base region. Additional masking steps are performed and P+ impurities are introduced to form the emitter region in the base and collector contact in the collector. A further mask is performed to provide an N+ base contact into the base region. The steps in a dielectrically isolated substrate is illustrated in FIGS. 1A–1C, which will be discussed below.

The process of the prior art generally requires a separate mask for the collector formation from the base formation. The use of the base mask and aperture to form an enhanced collector region in the collector to produce a high breakdown active device is described in U.S. Pat. Nos. 4,975,751 and 5,091,336. The enhanced collector region is the same conductivity type as the substrate. Adjusting a collector pattern to tune breakdown voltage in a bipolar transistor is shown in U.S. Pat. No. 6,555,894.

The present disclosure describes a method of forming a bipolar transistor which reduces the cost of manufacture by using the same mask to form the collector region in a substrate of an opposite conductivity type as to form the base in the collector region. More specifically, impurities of a first conductivity type are introduced into a region of a substrate of a second conductivity type through a first aperture in a first mask to form a collector region. Impurities of the second conductivity type are introduced in the collector through the first aperture in the first mask to form the base region. Impurities of the first conductivity type are then introduced into the base region through a second aperture in a second mask to form the emitter region.

When the region of the substrate is a dielectrically isolated region, the collector may be formed by diffusing introduced impurities for a sufficient time that they either reflect off the bottom of the dielectric isolation layer and spread laterally therefrom or extend at least to the bottom dielectric isolation layer. Also, the minimum dimension of the first aperture for the collector and base regions may be smaller than the depth of the formed collector region. The minimum dimension of the first aperture of the first mask is selected for a desired collector to base breakdown voltage. This allows tuning of the breakdown voltage.

These and other aspects of the present disclosure will become apparent from the following detailed description of the disclosure, when considered in conjunction with accompanying drawings.

DETAILED DESCRIPTION OF THE PREFERRED EMBODIMENTS

Figure 1A:
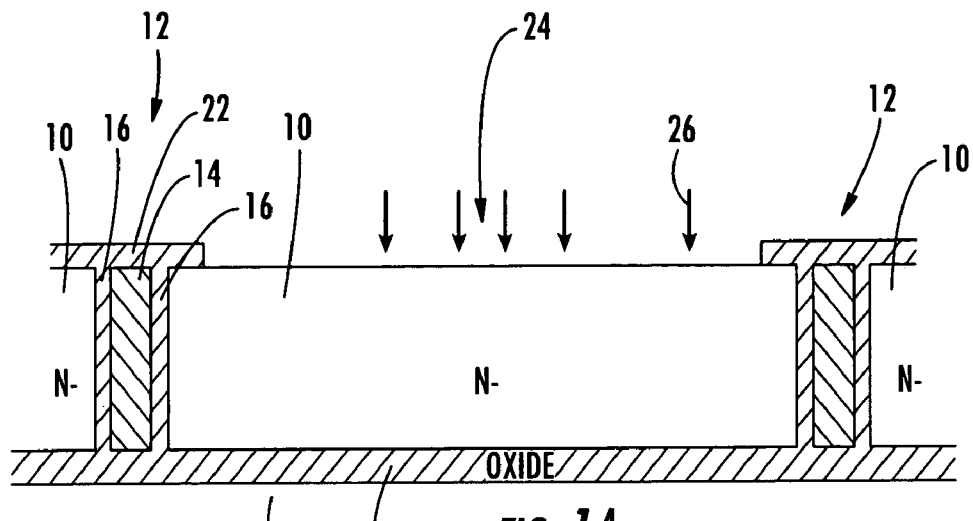
FIGS. 1A–1C are cross-sectional views of a process for the formation of a bipolar transistor according to the prior art.

A more detailed explanation of the prior art process will be discussed with respect to FIGS. 1A–1C. The same numbers for the same formed regions will be used in describing the method of the present disclosure in FIGS. 2A–2C. As shown in the drawings, the substrate regions are shown as dielectrically isolated. The process may also be used with junction isolation or a combination of junction and dielectric isolation.

Figure 1B:
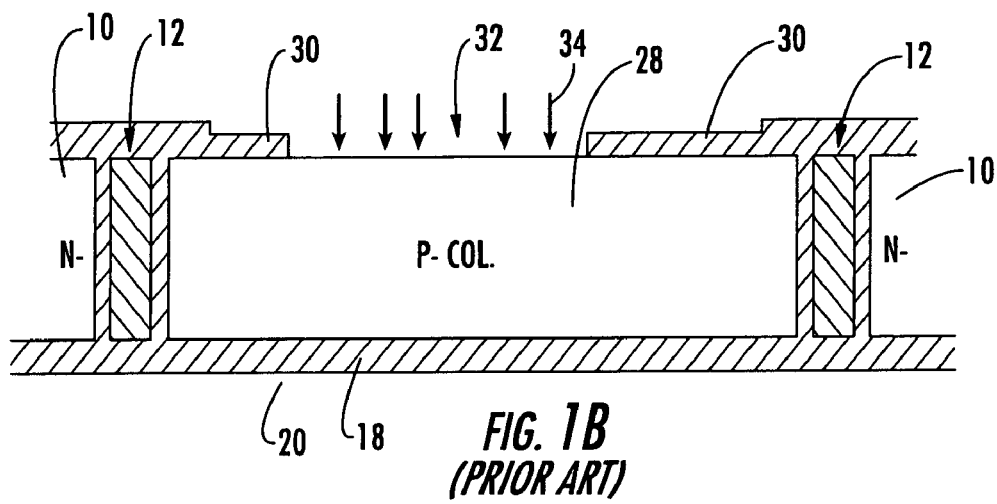
Figure 1C:
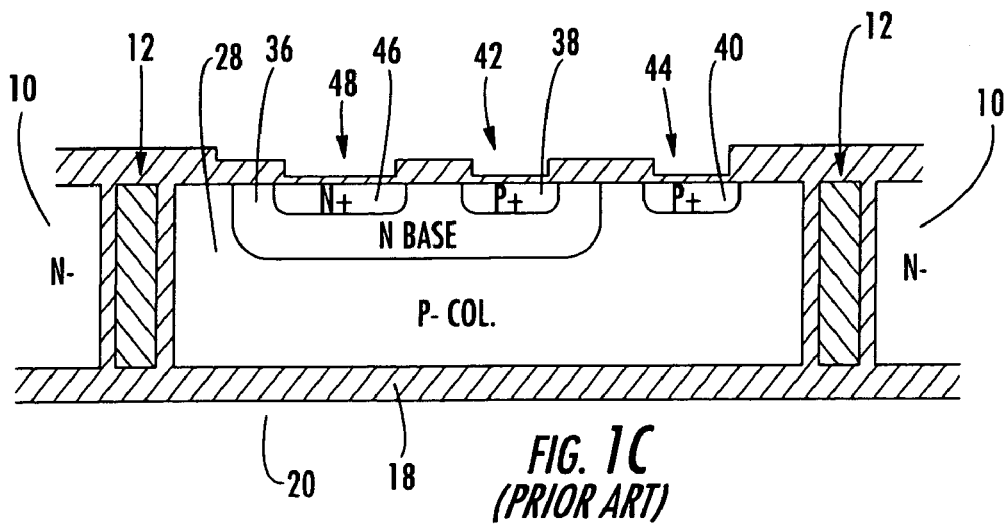

As illustrated in FIG. 1A, the substrate includes a plurality of regions 10, illustrated as N–, for example, laterally separated by trenches 12, which includes a polycrystalline fill 14 and dielectric or oxide layers 16. A bottom dielectric or oxide layer 18 connects the substrate regions 10 to a handle 20. The N– substrate regions 10 form the collector region of the NPN bipolar transistors. A mask 22 is formed having an aperture 24 therein. P-type impurities 26 (for example, boron) are introduced through the aperture 24 into the substrate region 10 in which a PNP transistor will be formed. Impurities 26, after introduction, are diffused to form the resulting P– collector region 28 illustrated in FIG. 1B. The diffusion of the impurities 26 are conducted for a sufficient time such that the total N– substrate is converted to a P– region. The smallest of the dimension of the opening 24 may be greater than the depth of the substrate 20. A second mask 30 is then formed over the substrate with an opening 32 defining the base diffusion. N-type impurities 34 (for example, phosphorous) are introduced into the collector region 28 through the opening 32. These impurities are diffused to form the base region 36, as illustrated in FIG. 1C.

This is followed by further masking steps to introduce P-type impurities to form the emitter region 38 in the base 36 through aperture 42 and collector contact region 40 through opening 44 in a mask. Subsequently, N-type impurities are introduced to form the N+ contact 46 in the base 36 through aperture 48 in a mask. As is well known, after the formation of the P– collector region or the opposite conductivity region of the substrate, the steps used to form the emitter region, collector contact and base contact are also used to form the emitter region, base contact and collector contact of an NPN transistor formed in the N– collector regions 10, which still exist or has not been converted to P– collectors.

As previously noted, this prior art process requires two separate masks for the collector and the base impurities. Also, the size of the aperture 24 in the collector mask 22 usually has minimum dimension greater than the depth of the substrate region 10. The diffusion process is often performed until the total of the substrate region 10 is converted to the P– impurities. There is lateral, as well as vertical, diffusion. The over extent of the lateral diffusion is absorbed or stopped by the lateral dielectric isolation layer 16.

Figure 2A:
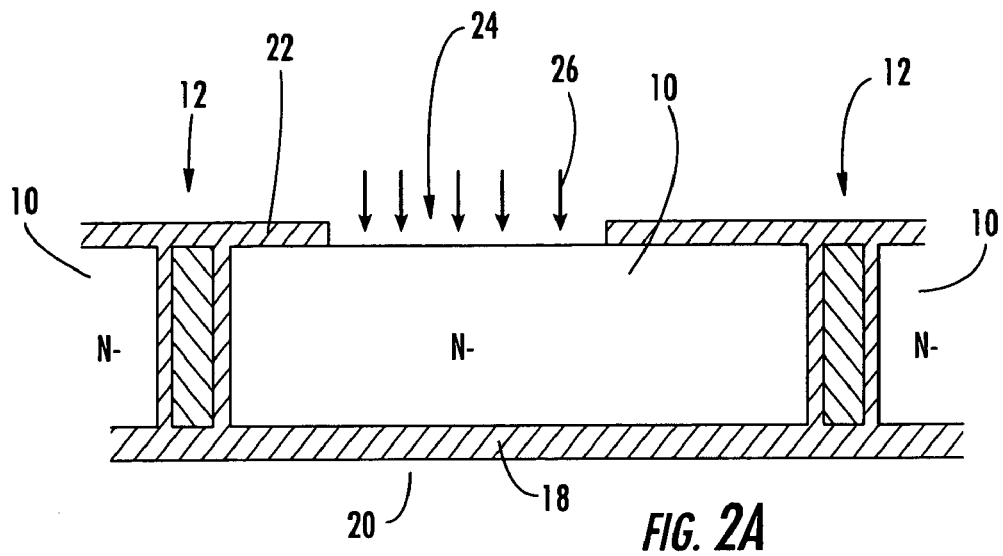
FIGS. 2A–2C are cross-sectional views of a process for the formation of a bipolar transistor incorporating the principles of the present disclosure.
Figure 2B:
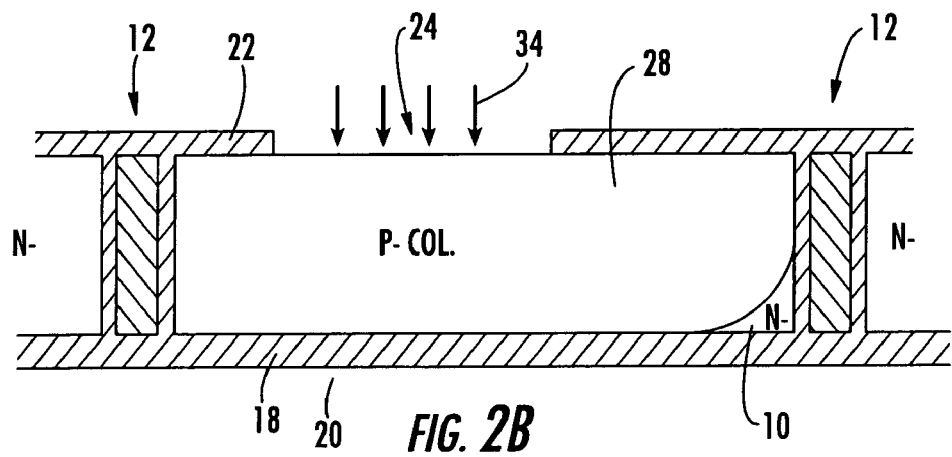
Figure 2C:
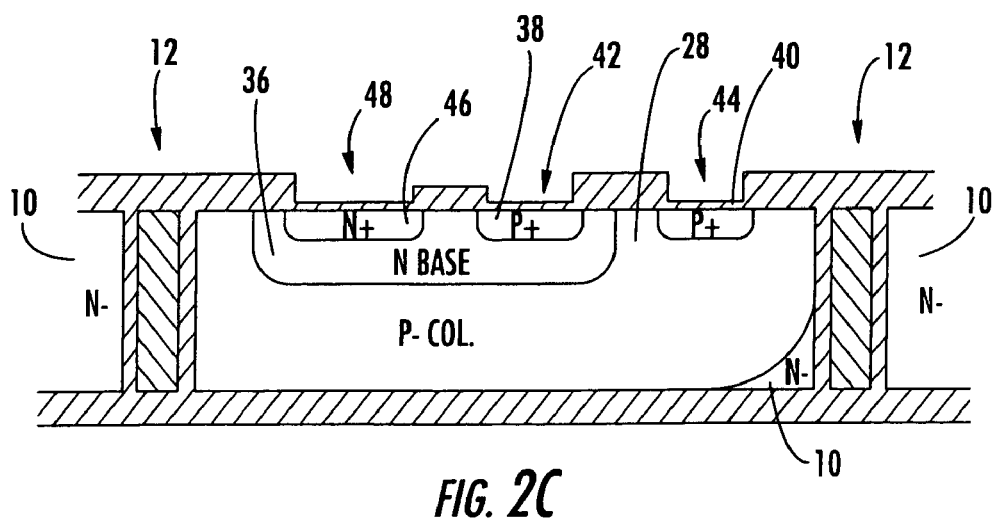

The improved method, as illustrated in FIG. 2A, forms an opening 24 in the mask layer 22. This opening is the same aperture that will be used for the collector and base region formation. This opening is substantially smaller than the opening 24 formed in mask 22 in FIG. 1A of the prior art. The opening 24 has the general dimensions of opening 32 of mask 30 of FIG. 1B of the prior art. Continuing the same example as the prior art, the N− substrate 10 has P-type impurities 26 introduced through mask opening 24. The introduced impurities may be diffused to form the collector region 28 illustrated in FIG. 2B.

Because the opening 24 is offset with respect to the left side with respect to the trenches 12, a corner on the right side may not be converted to the P− collector region. Since this is not an active part of the device, this will have no effect on the performance of the PNP transistor formed therein. The aperture 24 may have a minimum dimension smaller than the depth of the substrate 10. A diffusion is carried out sufficiently such that the impurities reach the at least bottom dielectric layer 18. Diffusion may also be carried out for an extended period of time such that the impurities reflect from the bottom layer 18 and extend laterally towards the lateral isolation 12.

Next, N-type impurities 34 are introduced through aperture 24 in the mask 22 and diffused to form the base region 36. If an oxide layer is formed in the aperture 24 during the collector diffusion, a wash process may be performed to remove it before introducing the N-type impurities 34. Alternatively, an oxidation inhibiting layer (for example, nitride) may be applied over the opening 24 during the diffusion process of the P-type impurities to form the collector. This oxidation inhibiting layer would then be removed again by a simple wash process. Using the nitride layer will also protect the surface against any impurities and defects during the diffusion process.

The diffusion of the collector impurities to form collector region 28 must be sufficient so as to provide a lateral area spaced from the subsequent base region 36 sufficient to form a collector contact 40 spaced from the base 36.

The process then continues as in the prior art with P-type impurities introduced through apertures 42, 44 to form the emitter region 38 in the base 36 and the collector contact 40 in the collector 28. This is followed by introducing N+ type impurities through aperture 48 and into the base 36 to form the base contact 46. Again, as in the prior art, this process is part of a complementary bipolar process with NPN transistors formed in other dielectrically isolated substrate regions 10 using some of the common steps used to form the PNP transistor described herein.

As is well known, the doping concentration of each of the diffused layers is maximum at the surface and decreases with depth. A doping concentration also decreases near the mask edge and has a lateral gradient towards zero outside its mask edge. The minimum dimension of the mask aperture defines the maximum impurity concentration in the diffusion profile. The smaller the minimum dimension, the lower the maximum impurity concentration. Thus, it defines the collector-base breakdown voltage. Since a single mask aperture is used to form the collector and the base, selection of the smaller collector mask aperture, when compared to the prior art, will produce a reduced maximum impurity concentration. In the present disclosure, the collector diffusion depth can be greater than the minimum dimension of the collector base aperture and, thus, the maximum collector impurity concentration is further reduced. By varying the minimum dimension of the combined collector base mask aperture 24, the maximum collector doping levels can be fine tuned in individual transistors in integrated circuits to match the different maximum voltage required for each of the transistor devices. A lower breakdown voltage device is made with higher collector doping levels that provide lower specific collector resistance. This allows these devices to be made smaller, thus reducing the chip area and cost of manufacture.

As a specific example, the substrate region 10 would have a depth of 14 microns and with lateral dimension of 56 by 71 microns. The common aperture 24 in the mask 22 of FIG. 2A would have dimension of 10 by 55 microns. The aperture 24 is compared to the aperture 24 in FIG. 1A having dimensions of 61 by 46 microns. For the same impurity concentration 26, the impurities 26 will be diffused for 30 or, optionally, 60 hours at 1250° C. in FIG. 2 versus 30 hours at 1250° C. for FIG. 1 of the prior art. For the 30-hour diffusion case, a minimum aperture, 24, dimension of 46 microns might yield a breakdown voltage BVCEO≈80V, while a minimum aperture, 24, dimension of 10 microns might yield BVCEO≈140V.

Although the present disclosure has been described and illustrated in detail, it is to be clearly understood that this is done by way of illustration and example only and is not to be taken by way of limitation. The scope of the present disclosure is to be limited only by the terms of the appended claims.

What is claimed is:

1. A method of forming bipolar transistors comprising:
   introducing impurities of a first conductivity type into a region of a substrate of a second conductivity type through a first aperture in a first mask and diffusing introduced impurities for a sufficient time to form a collector region that extends to a depth greater than a minimum dimension of the first aperture;
   introducing impurities of the second conductivity type in the collector through the first aperture in first mask to form a base region; and
   introducing impurities of a first conductivity type into the base region through a second aperture in a second mask to form an emitter region.

2. The method according to claim 1, wherein the collector region is formed by diffusing introduced impurities for a sufficient time that the collector region extends sufficiently laterally to accommodate a collector contact to the collector region; and including introducing impurities of the first conductivity type into the collector region to form a collector contact region spaced from the base region.

3. The method according to claim 2, wherein the collector contact region impurity introduction is through a third aperture in the second mask.

4. The method according to claim 1, wherein the impurity introduction steps are used to simultaneously form other semiconductor devices in other regions of the substrate using the first and second masks with additional apertures.

5. A bipolar transistor formed by the method of claim 1.

6. An integrated circuit having one or more bipolar transistors formed by the method of claim 1.

7. A method of forming bipolar transistors comprising:
   introducing impurities of a first conductivity type through a first aperture in a first mask into a region of a substrate of a second conductivity type and dielectrically isolated from other regions of the substrate and diffusing introduced impurities for a sufficient time that the collector region extends at least to a bottom dielectric isolation layer;
   introducing impurities of the second conductivity type in the collector through the first aperture in first mask to form a base region; and
   introducing impurities of a first conductivity type into the base region through a second aperture in a second mask to form an emitter region.

8. The method according to claim 7, wherein the collector region is formed by diffusing introduced impurities for a sufficient time that they reflect off a bottom dielectric isolation layer and spreads laterally there from.

9. A method of forming bipolar transistors comprising:
selecting a minimum dimension of a first aperture of a first mask to define a maximum impurity concentration in a collector region;
introducing impurities of a first conductivity type into a region of a substrate of a second conductivity type through the first aperture in the first mask to form a collector region having a maximum impurity concentration at or below the mask-defined maximum impurity concentration for a desired collector to base breakdown voltage;
introducing impurities of the second conductivity type in the collector through the first aperture in first mask to form a base region; and
introducing impurities of a first conductivity type into the base region through a second aperture in a second mask to form an emitter region.

10. The method according to claim 9, wherein the impurity introduction steps are used to simultaneously form other semiconductor devices in other regions of the substrate using the first and second masks with additional apertures.

11. The method of claim 10, including selecting different minimum dimensions for the aperture of the first mask in two different regions of the substrate such that the breakdown voltage of the collector-base junction formed using the larger minimum aperture is lower than the breakdown voltage formed using the smaller minimum aperture.

12. The method according to claim 9, including diffusing the impurities of first conductivity type.

13. A method of forming bipolar transistors comprising:
introducing impurities of a first conductivity type into a region of a substrate of a second conductivity type through a first aperture in a first mask;
depositing an oxidation inhibiting layer over the first aperture and diffusing introduced impurities to form a collector region;
removing the oxidation inhibiting layer and introducing impurities of the second conductivity type in the collector through the first aperture in first mask to form a base region; and
introducing impurities of a first conductivity type into the base region through a second aperture in a second mask to form an emitter region.

14. The method according to claim 13 in which the oxidation inhibiting layer is nitride.

* * * * *